(12) United States Patent
Beh et al.

(10) Patent No.: US 10,109,562 B2
(45) Date of Patent: Oct. 23, 2018

(54) LEADFRAME AND CHIP PACKAGE COMPRISING A LEADFRAME

(71) Applicant: OSRAM Opto Semiconductors GmbH, Regensburg (DE)

(72) Inventors: Sok Gek Beh, Gelugor (MY); Mei See Boon, Sg Siput (MY); Wing Yew Wong, Jelutong (MY); Hui Ying Pee, Bayan Lepas (MY)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/547,703

(22) PCT Filed: Feb. 6, 2015

(86) PCT No.: PCT/EP2015/052531
§ 371 (c)(1),
(2) Date: Jul. 31, 2017

(87) PCT Pub. No.: WO2016/124249
PCT Pub. Date: Aug. 11, 2016

(65) Prior Publication Data
US 2018/0033932 A1    Feb. 1, 2018

(51) Int. Cl.
*H01L 23/495*    (2006.01)
*H01L 21/00*    (2006.01)

(52) U.S. Cl.
CPC .... *H01L 23/49548* (2013.01); *H01L 23/4951* (2013.01)

(58) Field of Classification Search
CPC .................................................. H01L 23/49548
USPC .................................. 438/123; 257/676, 784
See application file for complete search history.

(56) References Cited

U.S. PATENT DOCUMENTS

| 6,459,130 B1 | 10/2002 | Arndt et al. |
| 2013/0105851 A1 | 5/2013 | Kim et al. |
| 2014/0061712 A1 | 3/2014 | Lin et al. |
| 2016/0218248 A1* | 7/2016 | Mollmer ................ H01L 24/97 |

FOREIGN PATENT DOCUMENTS

| EP | 2 709 177 A2 | 3/2014 |
| JP | 2006-339386 A | 12/2006 |
| WO | 2014/030530 A1 | 2/2014 |

* cited by examiner

*Primary Examiner* — Calvin Lee
(74) *Attorney, Agent, or Firm* — DLA Piper LLP (US)

(57) ABSTRACT

A leadframe includes first and second parts separated from each other, and each comprises at least one anchoring hole. The first part comprises a mounting area, the second part comprises an edge line facing the first part which is curved, and the first part comprises first, second and third portions each having a maximum width, wherein the mounting area is arranged at the third portion, and the third portion follows the second portion and the second portion follows the first portion in a direction of a longitudinal extent of the first part such that the third portion faces the second part.

14 Claims, 3 Drawing Sheets

LEADFRAME AND CHIP PACKAGE COMPRISING A LEADFRAME

TECHNICAL FIELD

This disclosure relates to a leadframe and a chip package comprising a leadframe.

BACKGROUND

Leadframes are used to serve as carriers for electronic devices such as light emitting diode chips and as electrical contacts. Chip packages are produced using leadframes and electronic devices, wherein the leadframes are embedded in the housing body. During manufacturing, there is risk to damage the housing body in a gap between two leadframe parts and and/or to displace the leadframe parts in the housing body.

It could therefore be helpful to provide a leadframe with an improved stability while arranged in a chip package and a chip package comprising a leadframe.

SUMMARY

We provide a leadframe including a first part and a second part, wherein the first part and the second part are separated from each other, the first part and the second part each include at least one anchoring hole, the first part includes a mounting area, the second part includes an edge line facing the first part which is curved, the first part includes a first portion (A) having a maximum width (A1), a second portion (B) having a maximum width (B1) and a third portion (C) having a maximum width (C1), wherein the mounting area is arranged at the third portion (C), the third portion (C) follows the second portion (B) and the second portion (B) follows the first portion (A) in a direction of a longitudinal extent (L) of the first part such that the third portion (C) faces the second part, the widths (A1, B1, C1) of the first, the second and the third portion (A, B, C) extend in a direction perpendicular to the longitudinal extent (L) of the first part, the maximum width (B1) of the second portion (B) is smaller than the maximum width (A1) of the first portion (A) and smaller than the maximum width (C1) of the third portion (C), and edge lines of the first (A) and the third portion (C) are non-parallel to each other as seen in a top view of the first part.

We also provide a chip package including the leadframe, wherein a light emitting diode chip is arranged at the mounting area of the first part, and the first part and the second part are embedded at least partly into a housing body such that the housing body penetrates through the anchoring holes of the first part and of the second part.

DETAILED DESCRIPTION

Figure 1:
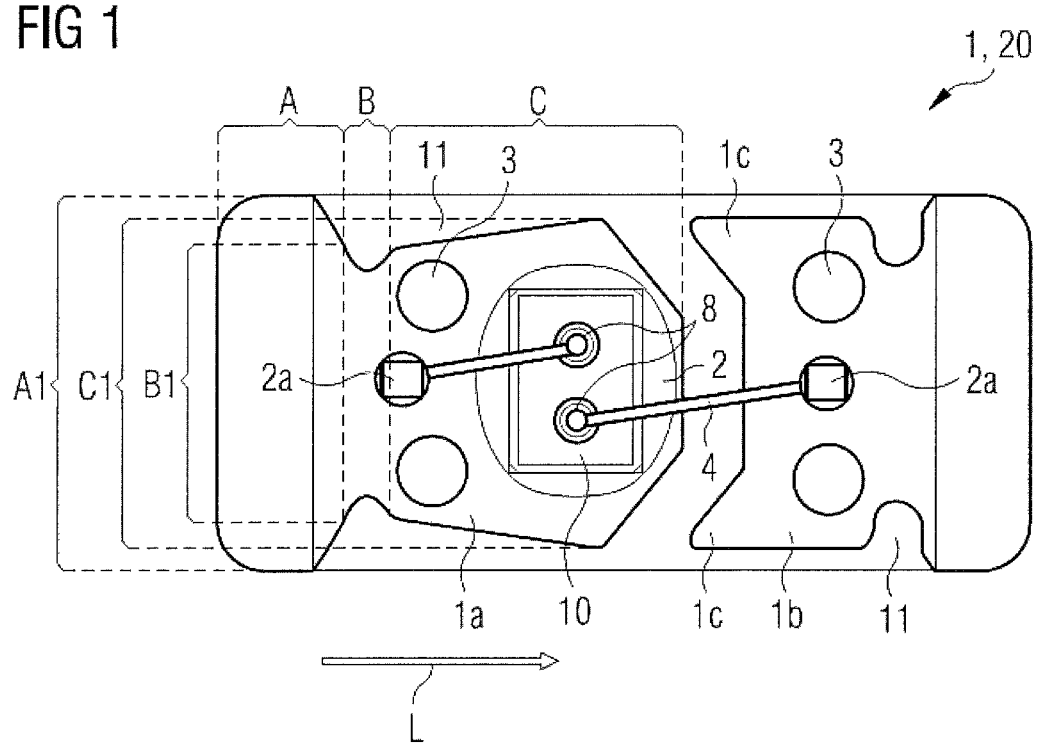
FIG. 1 shows a schematic illustration of a chip package in a top view in accordance with one example.

Our leadframe may comprise a first part and a second part, wherein the first part and the second part are separated from each other and the first part and the second part each comprise at least one anchoring hole and the first part comprises a mounting area.

An arrangement of metal parts stamped out or etched out from a plate is designated to be a leadframe. Leadframes are intended to have further elements like diode chips or wire bonds arranged on them. A leadframe or several component parts of a leadframe are preferably embedded in a housing body, for example, a mold compound. For the purpose of simplification and automatization of production methods of electronic devices or components having a leadframe, a leadframe can comprise several parts in the form of an endless strip. It is possible to produce several electronic devices or components on the leadframe, for example, by mounting several diode chips on the leadframe. The leadframe parts are contacted by wire bond connections, for example. Further, it is possible to embed the leadframe in a housing body. While separating the leadframe parts to form electronic devices, it is possible that the individual electronic device is damaged. For example, it is possible that while separating, for example, sawing the leadframe and the housing material, the leadframe part can be pulled out from the housing material or at least be displaced. To provide sufficient locking of leadframe parts in the housing material, anchoring holes are needed in the leadframe through which the housing material can emerge. Preferably, the anchoring holes penetrate completely through the leadframe.

The mounting area on the first part is provided for an electronic component, for example, a light emitting diode chip to be mounted on which can be electrically connected to the second part of the leadframe, for example, by a wire bond. Both the first and the second part comprise at least one anchoring hole for an improved fixing of a housing body. The first part of the leadframe is provided to be contacted to an opposite electrical polarity than the second part. This requires a separation of the first and the second leadframe part, in particular, by a gap between them.

The second part of the leadframe comprises an edge line facing the first part which is curved.

Preferably, to prevent generation of cracks in a housing body in a gap between the first and the second part of the leadframe, the edge line of the second part of the leadframe facing the first part is curved. The edge line is preferably shaped in a convex or concave manner. Further, it is also possible for the edge line to comprise segments, wherein some segments can form a straight line. For example, it is possible for the edge line of the second part facing the first part to have a polygonal shape.

Further, the first part comprises a first portion having a maximum width, a second portion having a maximum width and a third portion having a maximum width, wherein the mounting area is arranged at the third portion. The third portion follows the second portion and the second portion follows the first portion in a direction of a longitudinal extent of the first part such that the third portion faces the second part.

Further, the widths of the first, the second and the third portion extend in a direction perpendicular to the longitudinal extent of the first part, wherein the maximum width of the second portion is smaller than the maximum width of the first portion and smaller than the maximum width of the third portion.

The leadframe is oriented such that the first portion of the first part of the leadframe faces away from the second part. The first portion can at least partly be provided to electrically contact and mechanically fix the leadframe. For example, the first portion can at least partly remain free of an embedding housing material. For reasons of mechanical fixing and electrical connection to a neighboring component, for example, to a circuit board, the maximum width of the first portion should be as large as possible, preferably larger than the maximum width of the second portion. The second portion preferably has a small length compared to the length of the first and the third portion, wherein the length of each portion extends in a direction parallel to the longitudinal extent of the first part. The edge lines of the first and of the third portion extending away from the second portion are preferably not parallel with respect to a line representing the longitudinal extent of the first part. In other words, the leadframe expands in width in a longitudinal direction away from the second portion. This results in a more stable embedment of the leadframe in a housing body.

Further, edge lines of the first and the third portions are non-parallel to each other, as seen in a top view of the first part.

The edge lines of the first part can have a polygonal shape. An example of the first part of the leadframe with edge lines non-parallel to each other is advantageous while the leadframe is embedded in a housing body, for example, in a mold compound. During a manufacturing process of an electronic device comprising the leadframe, the first part is prevented from being displaced inside the housing body or even pulled out of it during an external processing step, for example, sawing of the housing body.

The at least one anchoring hole in the first part may be located in the third portion between the mounting area and the second portion.

The mounting area is provided on the third portion such that it captures an area of the third portion which is as large as possible, but does not cover the entire area of the third portion. The at least one anchoring hole is located on the remaining area of the third portion not occupied by the mounting area. Preferably, the number of anchoring holes is reduced compared to commonly known leadframes to enlarge the mounting area for a chip. In this way, it is possible to maximize the available mounting area and provide a wire bonding region, which is particularly advantageous for small chip packages. As a result, it is possible to mount a comparatively large chip, in relation to the size of the first part of the leadframe, on the mounting area and provide more than one wire bonding region. The use of larger chips results in an improved performance of an electronic device comprising a leadframe without a significant increase in size of the leadframe.

The first part and the second part may comprise two anchoring holes each.

Compared to commonly known leadframes, the number of anchoring holes is reduced to two. As a result, fixing a housing body at the leadframe is still possible in a sufficient amount by two anchoring holes and the available mounting area for mounting a chip is increased.

The second part may comprise a wire bonding region.

To make electrical contact with a chip mounted on the mounting area of the first part, it is advantageous to locate the wire bonding region of the second part close to the edge of the second part facing the third portion of the first part.

The first part and the second part may form a crooked gap between each other.

To make a device comprising a leadframe in a housing body more robust against external forces, for example, mechanical forces on the leadframe in a direction perpendicular to the width of the third portion and its longitudinal extent, the first part and the second part form a crooked gap between each other. Preferably, the gap between the first and the second part has a c-shape. Due to the curved shape of the gap, formation of cracks in the housing body between the first and the second part is reduced.

The first part may comprise a wire bonding region.

To make electric contact between a chip mounted on the mounting area with the first part of the leadframe, a wire bonding region on the first part is advantageously arranged on either the first, the second or the third portion of the first part of the leadframe. This is especially useful for chips not contacted from their lower side facing the mounting area of the first part of the leadframe, for example, chips having a sapphire substrate, or other chips also needing two wire bonds for electrical contacting. The wire bonding region can be located at any of the first, the second or the third portion of the first part. Preferably, the wire bonding region is located on the third portion between the mounting area and the second portion situated next to an anchoring hole or between a plurality of anchoring holes.

The second part may comprise edge regions protruding beyond a central region of the curved edge line facing the first part in a direction towards the first part.

The edge line of the second part facing the first part comprises segments, wherein in edge regions of the second part the curved shape of the edge line is achieved by segments protruding beyond a central region of the curved edge line in a direction towards the first part. Preferably, the edge regions of the second part do not comprise any anchoring holes to increase the material area of the second part of the leadframe which can be embedded in a housing material. Consequently, the locking force inside a housing body is increased for the second part by its edge regions. This can advantageously be achieved by edge lines and segments of the edge line of the second part non-parallel to each other. When the second part of the leadframe comprises a metal, the metal areas in the center of an electronic component comprising the leadframe and a housing body are increased and locking the leadframe in the housing body is improved. An improved locking of the leadframe in the housing is achieved against stresses caused by high temperature, high humidity and against impact on the housing by process steps.

The leadframe may comprise a plurality of first parts and second parts.

The first part and the second part can be parts of leadframe strips comprising a plurality of first parts and a plurality of second parts that may be placed during manufacturing adjacent to each other such that in a pair a first part faces a second part. It is advantageous to embed the strips in a housing body. The individual pairs can then be separated in a manufacturing process, for example, by sawing to produce a plurality of electronic devices comprising the leadframe parts. The strips can be an endless-strip for machine-processing and automatized processing.

A chip package may comprise a leadframe having a first part and a second part, wherein a light emitting diode chip is arranged at a mounting area of the first part, and the first part and the second part are embedded at least partly into a housing body such that the housing body penetrates through anchoring holes of the first part and of the second part.

Electrical contact may be made between the light emitting diode chip arranged at the mounting area of the first part and the second part of the leadframe.

A second electrical contact with the chip can be made by contact pads placed below the mounting area.

The light emitting diode chip may be contacted by a wire bond to the wire bonding region of the first part and by another wire bond to a wire bonding region of the second part of the leadframe.

In particular, a chip having two upper contacts electrically contacted by wire bonds can be advantageously mounted on the first part of the leadframe and contacted to both wire bonding regions.

The housing body may comprise a mold compound.

The first and second leadframe parts are preferably embedded partly in the housing body. In particular, the first part comprises a first portion that remains free of the mold compound. Also, the second part comprises an edge region facing away from a gap between the first and the second part and remains free of the material of the housing body. The part of the second part remaining free of the material of the housing body can be used to attach the leadframe mechanically or electrically to a neighboring component, for example, to a circuit board. The leadframe is preferably sealed with the mold compound such that the mold compound penetrates through anchoring holes and embeds the leadframe, the wire bond(s) and the chip. It is possible for the mold compound to comprise a resin, an epoxy mold compound (EMC), silicone, hybrid EMC or other encapsulation materials. It is also possible for the mold compound to comprise additional materials such as phosphors. After sealing, the mold can be hardened and, if the leadframe comprises a plurality of pairs of first and second parts, the mold can be cut, for example, sawed to individual components comprising pairs of leadframe parts.

The light emitting diode chip may have a sapphire substrate.

Chips comprising a sapphire substrate can have two wire bonds to make electrical contact. For the purpose of mounting a chip having a sapphire substrate, the first part of the leadframe can comprise a wire bonding region.

Further advantages will become apparent from the examples described below in association with the figures.

Identical or identically acting elements are provided with the same reference signs in the figures. The sizes of the individual elements and the size relationships of the elements among one another should not be regarded as true to scale.

FIG. 1 shows a chip package 20 in a top view on the leadframe 1 comprising a first part 1a and a second part 1b. The leadframe parts are preferably produced as metal parts stamped out or etched out from a plate. The first part 1a has three portions A, B and C, wherein the first portion A has a maximum width A1, the second portion B has a maximum width B1 and the third portion C has a maximum width C1. The third portion C comprises a mounting area 2. The third portion C follows the second portion B and the second portion B follows the first portion A in a direction of a longitudinal extent L of the first part 1a such that the third portion C faces the second part 1b. Both parts 1a and 1b are electrically isolated from each other and separated by a gap between them so that one part can be contacted to an anode and the other to a cathode or vice versa. In the third portion C, two anchoring holes 3 are arranged at the first part 1a penetrating the leadframe completely. Likewise, the second part 1b comprises two anchoring holes 3 penetrating the leadframe completely.

The first part 1a comprises a wire bonding region 2a to contact a wire bond 4 outside the mounting area 2 on the third portion C located between the mounting area 2 and the second portion B. A light emitting diode chip 10 is mounted on the mounting area 2. The light emitting diode chip 10 has two electrode pads 8 on its top side connected by wire bonds 4 to wire bonding regions 2a of the first part 1a and the second part 1b.

Due to the fact that the first part comprises only two anchoring holes 3, more space is available for a chip to be mounted on the mounting area 2.

The widths A1, B1 and C1 extend in a direction perpendicular to the longitudinal extent L of the first part, wherein the maximum width B1 is smaller than the maximum width A1 and smaller than the maximum width C1.

The leadframe is oriented such that the first portion A of the first part 1a faces away from the second part 1b.

Both parts 1a and 1b of the leadframe are embedded in a housing body 11 preferably comprising a mold compound. In such a configuration, the mold extends through the anchoring holes 3 and fixes the parts 1a and 1b in it. The first and the second part are only partly embedded in the housing body 11. The outer edges of the parts 1a and 1b, such as the first portion A of part 1a, are partly not embedded in the housing body and provide electrical and mechanical access to the environment of the leadframe.

The second portion B has preferably a small length compared to the length of the first portion A and the third portion C, wherein the length of each portion extends in a direction parallel to the longitudinal extent L of the first part 1a. Further, the edge lines of the first and of the third portion extending away from the second portion are preferably not parallel with respect to a line representing the longitudinal extent of the first part. In other words, the leadframe expands in width with increasing distance from the second portion what results in a more stable embedment of the leadframe, in particular of the third portion C, in the housing body 11. As seen in a top view, edge lines of the first and the third portions are non-parallel to each other. The edge lines of the first part 1a have a polygonal shape, wherein due to the increased width of the third portion compared to the second portion and due to only two anchoring holes 3 in the third portion the mounting area 2 is maximized on the first part 1a of the leadframe. Also, the second part 1b comprises a polygonal shape.

Further, the edge line of the second part 1b facing the first part 1a comprises segments, wherein in edge regions 1c of the second part 1b the curved shape of the edge line is achieved by segments protruding beyond a central region of the curved edge line in a direction towards the first part 1a. The edge regions 1c of the second part 1b do not comprise anchoring holes what results in an increased material area of the second part 1b to be embedded in the housing body 11 in the central region of the chip package 20. Consequently, the locking force inside a housing body 11 is increased for the second part 1b by its edge regions 1c.

Because of the unparallel edge lines, the locking force of the first part 1a and of the second part 1b in the housing body is increased. Consequently, the first part 1a and the second part 1b are prevented from being displaced inside the housing body 11 or even pulled out of it during an external processing step, for example, sawing of the housing body while separating it from a larger compound. Advantageously, a chip package 20 is achieved which has an increased locking force acting on the leadframe while the leadframe and the housing body are exposed to outer forces and has an increased mounting area on which larger chips 10, for example, chips having a sapphire substrate can be mounted.

A crooked gap between the first and the second part makes the chip package more robust against external forces, for example, mechanical forces on the leadframe in a direction perpendicular to the width of the third portion C and to its longitudinal extent. The gap between the first and the second part has a c-shape. Due to the curved shape of the gap, formation of cracks in the housing body between the first and the second part is advantageously reduced.

Figure 2:
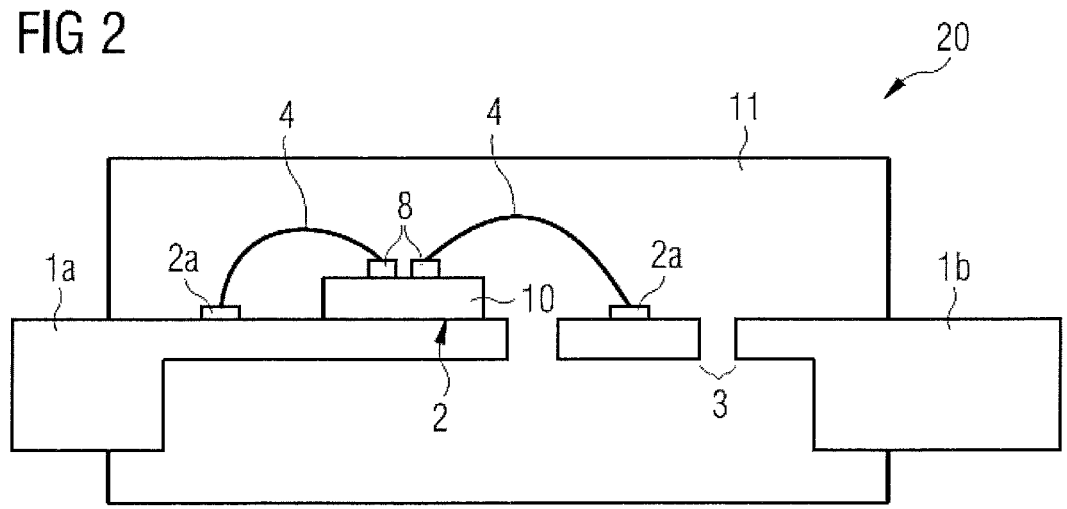
FIG. 2 shows a schematic illustration of the chip package in a sectional view in accordance with one example.

FIG. 2 shows a schematic illustration of a chip package 20 as shown in FIG. 1 in a sectional view. The second part 1b differs from the illustration shown in FIG. 1 in the position of the anchoring hole 3 and the wire bonding region 2a on the second part 1b. An anchoring hole 3 is located laterally adjacent to a wire bonding region 2 on the second part 1b, wherein the wire bonding region is located between the anchoring hole and an edge of the second part 1b facing the first part 1a. It can be seen that the anchoring hole 3 completely penetrates the second part 1b of the leadframe and that the housing body 11 embeds the first and the second part of the leadframe and penetrates through the anchoring hole 3. Also, the first part 1a comprises at least one anchoring hole, but in the example shown in FIG. 2, the anchoring hole is not located on the cut line through the chip package and thus not shown. Further, the example of the chip package 20 shown in FIG. 2 comprises leadframe parts 1a and 1b that are only partly embedded in the housing body 11. The outer portions of the first and the second part have a larger thickness than the inner portions of the first and the second part. The housing embeds the first and the second part such that the outer portions are partly free of the housing body. This is advantageous in providing a mechanical fixing and electrical connection to a neighboring component, for example, to a circuit board.

A chip 10 comprises two contact pads 8 on its top side, preferably the chip 10 comprises a sapphire substrate. Such a chip is characterized by a comparatively large dimension and needs two contacts at its top side. Two wire bonds 4 are led to the contact pads 8 on the top side of the chip 10. One wire bond 4 connects to a wire bonding region 2a on the first part 1a and another wire bond 4 connects to a wire bonding region 2a on the second part 1b. For example, the chip 10 having a sapphire substrate can have dimensions of up to 11 mil×14 mil, as seen in top view on the leadframe. It is also possible for the chip to be as large as the mounting area.

Figure 3A:
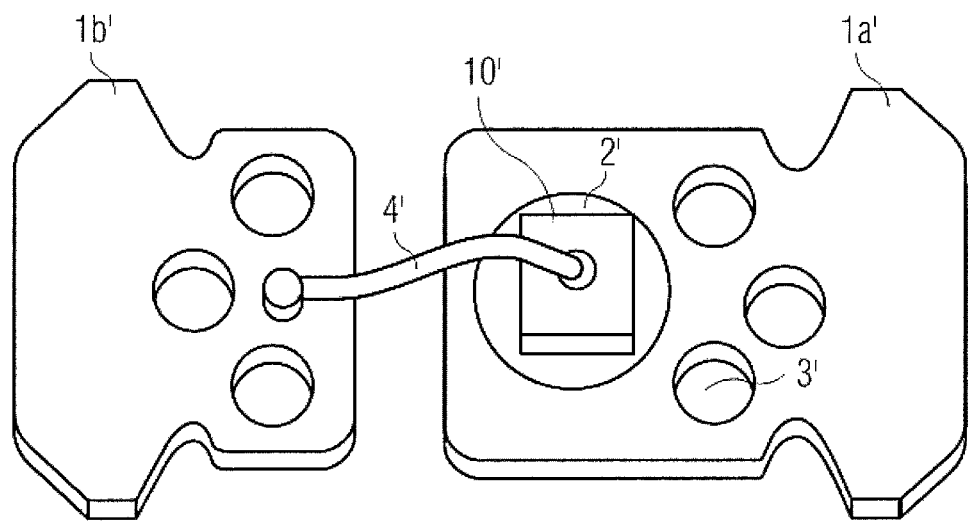
FIGS. 3a and 3b show a comparison between a chip package comprising a known leadframe and a chip package comprising a leadframe in accordance with one example.
Figure 3B:
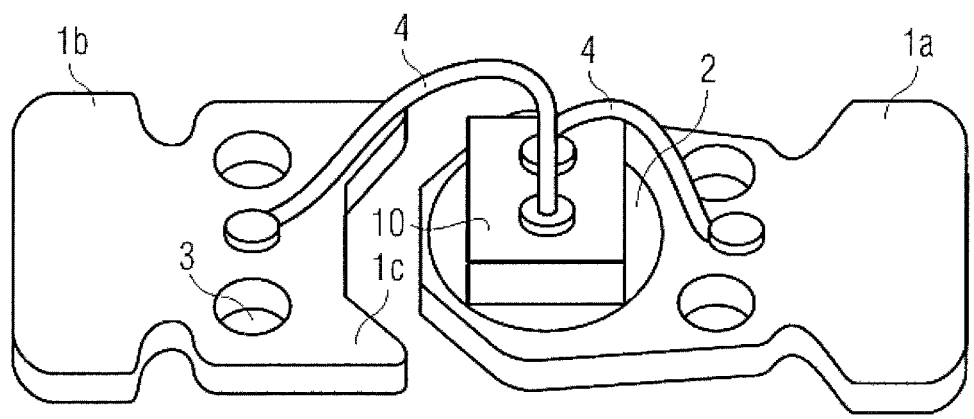

FIGS. 3a and 3b show a comparison between a known leadframe (FIG. 3a) and our leadframe (FIG. 3b). In FIG. 3a, a leadframe comprising two parts 1a' and 1b' with a chip 10' mounted on part 1a' is shown, wherein both parts comprise three anchoring holes 3' and only one wire bonding region on the second part 1b' which connects a chip 10' and a wire bond 4'. Compared to FIG. 3b, the leadframe of FIG. 3a can only allow chips to be mounted on it having a significantly smaller size than the chips that can be mounted on the first part 1a of the leadframe of FIG. 3b. It can clearly be seen that reduction of anchoring holes 3 to a number of two in FIG. 3b allows an increased mounting area and the possibility also to apply a wire bonding region on the first part 1a of the leadframe.

Further, the leadframe shown in FIG. 3a differs from the leadframe shown in FIG. 3b by alignment of the edge lines. The leadframe parts 1a' and 1b' shown in FIG. 3a have edge lines parallel to each other, for example, edge lines are parallel to each other in FIG. 3a, but not in FIG. 3b where the first and the second part 1a' and 1b' are separated by a gap. The example shown in FIG. 3b is characterized by an improved locking of leadframe parts 1a and 1b in the housing body. In particular, the design of the leadframe parts shown in FIG. 3b can provide a locking force inside a housing body up to 10% larger than the locking force provided by a design of leadframe parts 1a' and 1b' shown in FIG. 3a. For example, the leadframe shown in FIG. 3b can provide a locking force of up to 843.71 N and the leadframe shown in FIG. 3a can provide a locking force of up to 768.1 N.

External forces, for example, mechanical forces that act on the leadframe in a direction perpendicular to the top side of the leadframe parts can cause cracks in a housing body in the gap between the two leadframe parts. For the crooked gap in FIG. 3b, formation of cracks is reduced.

Figure 4:
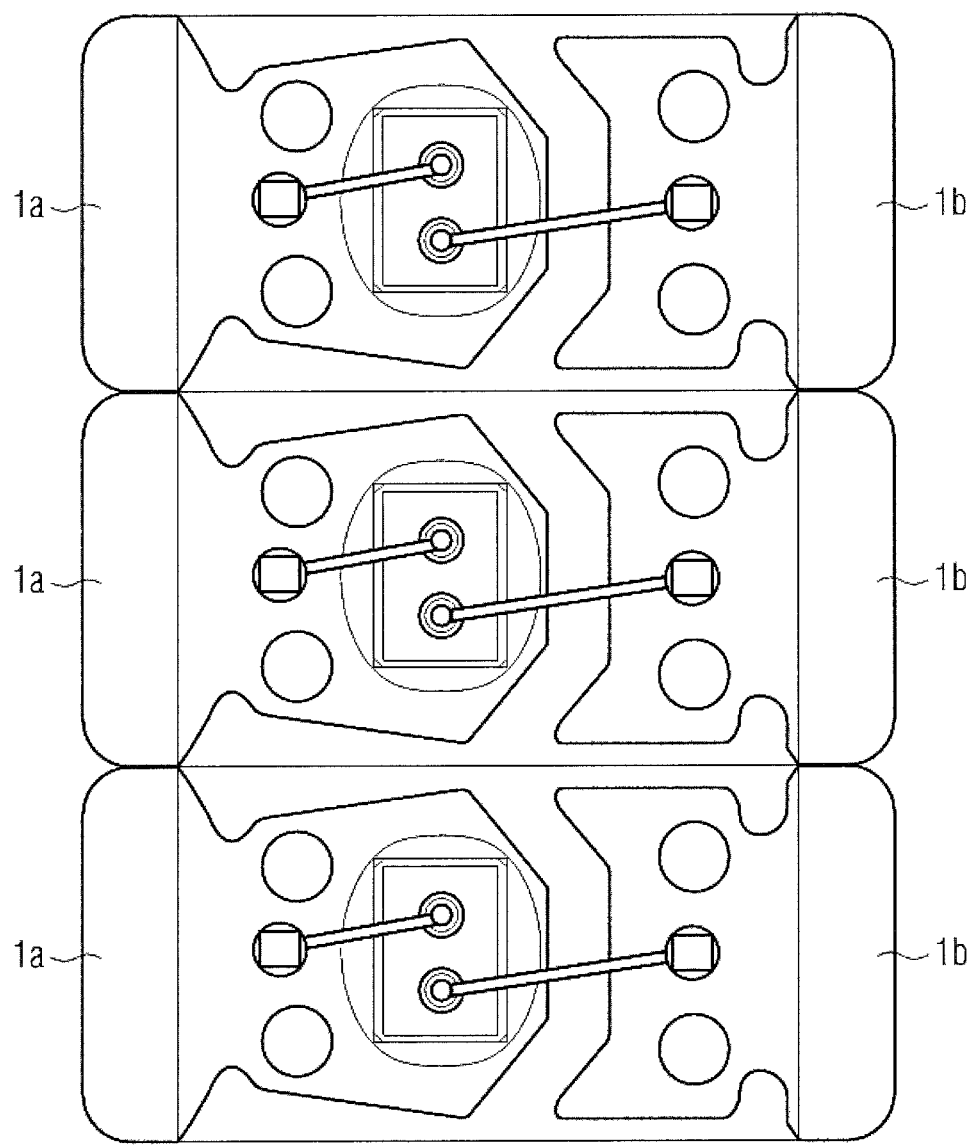
FIG. 4 shows a schematic illustration of a leadframe comprising a plurality of leadframe parts.

FIG. 4 shows a plurality of chip packages 20 with a leadframe 1 comprising a plurality of first and second parts 1a and 1b. The plurality of first parts 1a and second parts 1b are strips comprising a plurality of first parts and a plurality of second parts. A first part 1a and a second part 1b are individually placed adjacent to each other and form a pair of leadframe parts. The strips are embedded partly in a housing body and can be separated into individual pairs in a manufacturing process, for example, by sawing to produce a plurality of chip packages 20 each comprising the leadframe parts 1a and 1b. The strips are preferably in the form of an endless-strip for machine-processing and automatized processing.

Furthermore, other combinations of the features described in the figures and also in the examples in the general part are also possible, even if they are not explicitly shown in the figures.

Our leadframes and chip packages are not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A leadframe, comprising a first part and a second part, wherein
    the first part and the second part are separated from each other,
    the first part and the second part each comprise at least one anchoring hole,
    the first part comprises a mounting area,
    the second part comprises an edge line facing the first part which is curved,
    the first part comprises a first portion (A) having a maximum width (A1), a second portion (B) having a maximum width (B1) and a third portion (C) having a maximum width (C1), wherein the mounting area is arranged at the third portion (C),
    the third portion (C) follows the second portion (B) and the second portion (B) follows the first portion (A) in a direction of a longitudinal extent (L) of the first part such that the third portion (C) faces the second part,
    the widths (A1, B1, C1) of the first, the second and the third portion (A, B, C) extend in a direction perpendicular to the longitudinal extent (L) of the first part,
    the maximum width (B1) of the second portion (B) is smaller than the maximum width (A1) of the first portion (A) and smaller than the maximum width (C1) of the third portion (C), and
    edge lines of the first (A) and the third portion (C) are non-parallel to each other as seen in a top view of the first part.

2. The leadframe according to claim 1, wherein the second part comprises edge regions protruding beyond a central region of the curved edge line facing the first part in a direction towards the first part.

3. The leadframe according to claim 1, wherein the at least one anchoring hole in the first part is located in the third portion (C) between the mounting area and the second portion (B).

4. The leadframe according to claim 1, wherein the leadframe comprises a plurality of first parts and second parts.

5. The leadframe according to claim 1, wherein the first part and the second part form a crooked gap between each other.

6. The leadframe according to claim 1, wherein the first part and the second part comprise two anchoring holes each.

7. The leadframe according to claim 1, wherein the second part comprises a wire bonding region.

8. The leadframe according to claim 1, wherein the first part comprises a wire bonding region.

9. A chip package comprising the leadframe according to claim 1, wherein
a light emitting diode chip is arranged at the mounting area of the first part, and
the first part and the second part are embedded at least partly into a housing body such that the housing body penetrates through the anchoring holes of the first part and of the second part.

10. The chip package according to claim 9, wherein the light emitting diode chip is contacted by a wire bond to the wire bonding region of the first part and by another wire bond to a wire bonding region of the second part of the leadframe.

11. The chip package according to claim 9, wherein electrical contact is made between the light emitting diode chip arranged at the mounting area of the first part and the second part of the leadframe.

12. The chip package according to claim 9, wherein the housing body comprises a mold compound.

13. The chip package according to claim 9, wherein the light emitting diode chip has a sapphire substrate.

14. The chip package according to claim 9, wherein the housing body embeds the first and the second part of the leadframe.

* * * * *